United States Patent
Bonilla et al.

(10) Patent No.: US 9,786,760 B1
(45) Date of Patent: Oct. 10, 2017

(54) AIR GAP AND AIR SPACER PINCH OFF

(71) Applicant: International Business Machines Corporation, Armonk, NY (US)

(72) Inventors: Griselda Bonilla, Hopewell Junction, NY (US); Elbert Huang, Carmel, NY (US); Son Nguyen, Schenectady, NY (US); Takeshi Nogami, Schenectady, NY (US); Christopher J. Penny, Saratoga Springs, NY (US); Deepika Priyadarshini, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/280,457

(22) Filed: Sep. 29, 2016

(51) Int. Cl.
*H01L 29/49* (2006.01)
*H01L 29/423* (2006.01)
(Continued)

(52) U.S. Cl.
CPC ...... *H01L 29/4991* (2013.01); *H01L 21/7682* (2013.01); *H01L 21/76805* (2013.01); *H01L 21/76895* (2013.01); *H01L 21/823437* (2013.01); *H01L 21/823468* (2013.01); *H01L 21/823475* (2013.01); *H01L 21/823487* (2013.01); *H01L 27/088* (2013.01); *H01L 29/42392* (2013.01); *H01L 29/66666* (2013.01);
(Continued)

(58) Field of Classification Search
CPC .......... H01L 21/76–21/761; H01L 21/823493; H01L 21/823481; H01L 21/823878; H01L 21/823892; H01L 27/1463; H01L 2027/11829; H01L 2027/11831; H01L 29/0642–29/0653; H01L 21/76264; H01L 21/76289; H01L 21/764
See application file for complete search history.

(56) References Cited

U.S. PATENT DOCUMENTS

| 7,932,176 B2 | 4/2011 | Gordon et al. |
| 8,222,134 B2 | 7/2012 | Gordon et al. |

(Continued)

FOREIGN PATENT DOCUMENTS

WO 2014118750 A1 8/2014

OTHER PUBLICATIONS

Bonilla et al., "Air Gap and Air Spacer Pinch Off," U.S. Appl. No. 15/299,906, filed Oct. 21, 2016.
(Continued)

*Primary Examiner* — Cuong B Nguyen
*Assistant Examiner* — Juanita Rhodes
(74) *Attorney, Agent, or Firm* — Cantor Colburn LLP; Vazken Alexanian

(57) ABSTRACT

Embodiments are directed to a method of forming a semiconductor device and resulting structures having an air spacer between a gate and a contact by forming a gate on a substrate and over a channel region of a semiconductor fin. A contact is formed on a doped region of the substrate such that a space between the contact and the gate defines a trench. A first dielectric layer is formed over the gate and the contact such that the first dielectric layer partially fills the trench. A second dielectric layer is formed over the first dielectric layer such that an air spacer forms in the trench between the gate and the contact.

7 Claims, 15 Drawing Sheets

(51) Int. Cl.
*H01L 27/088* (2006.01)
*H01L 29/66* (2006.01)
*H01L 29/786* (2006.01)
*H01L 21/768* (2006.01)
*H01L 21/8234* (2006.01)

(52) U.S. Cl.
CPC .. *H01L 29/78618* (2013.01); *H01L 29/78642* (2013.01); *H01L 29/78696* (2013.01)

(56) References Cited

U.S. PATENT DOCUMENTS

| | | | |
|---|---|---|---|
| 8,871,624 B2 | 10/2014 | Horak et al. | |
| 8,962,474 B2 | 2/2015 | Yu et al. | |
| 9,048,294 B2 | 6/2015 | Tang et al. | |
| 9,305,835 B2 | 4/2016 | Alptekin et al. | |
| 9,373,542 B2 | 6/2016 | Zhang et al. | |
| 2006/0108609 A1* | 5/2006 | Engel | H01L 23/3192 257/213 |
| 2006/0154478 A1* | 7/2006 | Hsu | H01L 21/76835 438/637 |
| 2010/0102363 A1* | 4/2010 | Hause | H01L 29/41775 257/288 |
| 2014/0220772 A1* | 8/2014 | Lakshmanan | H01L 21/76856 438/597 |
| 2015/0144999 A1* | 5/2015 | Ching | H01L 29/66795 257/190 |
| 2015/0228585 A1 | 8/2015 | He et al. | |
| 2015/0228754 A1 | 8/2015 | Sung | |
| 2015/0380302 A1* | 12/2015 | Mountsier | H01L 21/76831 438/654 |
| 2016/0181150 A1 | 6/2016 | Liu et al. | |
| 2016/0365426 A1* | 12/2016 | Ching | H01L 29/6656 |

OTHER PUBLICATIONS

List of IBM Patents or Patent Applications Treated as Related; Date Filed: Sep. 29, 2016, pp. 1-2.

\* cited by examiner

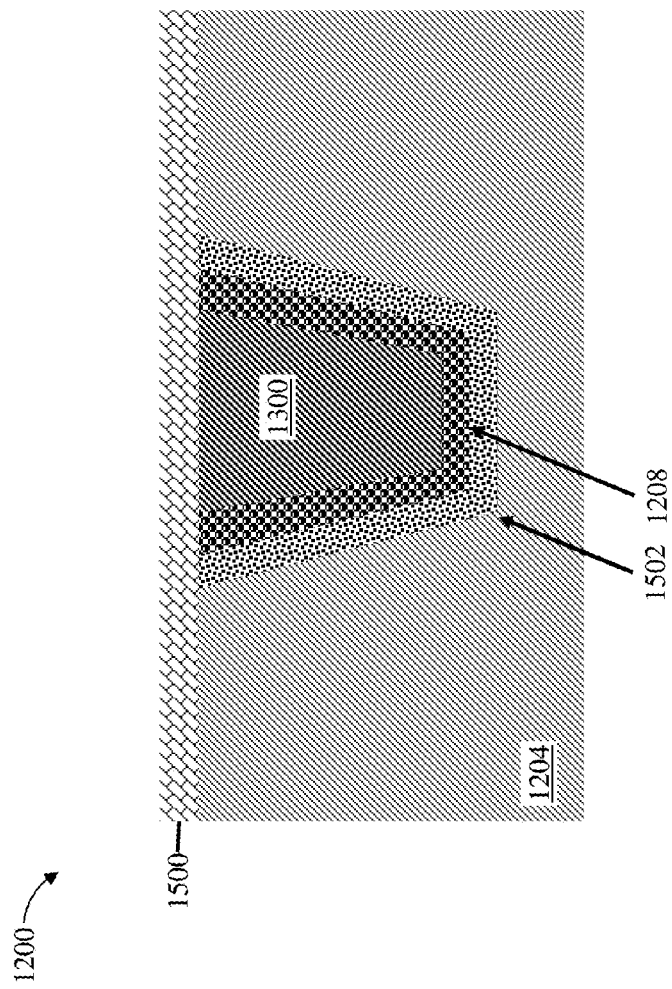

AIR GAP AND AIR SPACER PINCH OFF

BACKGROUND

The present invention relates in general to semiconductor device fabrication methods and resulting structures. More specifically, the present invention relates to fabrication methods and resulting structures for a semiconductor device having an air spacer between a gate and a contact. The present invention also relates to fabrication methods and resulting structures for a semiconductor device having an air gap between metal interconnect layers.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch. Unfortunately, as device dimensions and component spacing shrink, parasitic capacitance tends to increase. Parasitic capacitance, or conductor-to-conductor capacitance, between two conductors is a function of the length and thickness of the conductors, as well as the distance separating the conductors.

SUMMARY

According to embodiments of the present invention, a method of fabricating a semiconductor device having an air spacer between a gate and a contact is provided. The method can include forming a gate on a substrate, wherein the gate is also formed over a channel region of a semiconductor fin. A contact is formed on a doped region of the substrate, and a space between the contact and the gate defines a trench. A first dielectric layer is formed over the gate and the contact, and the first dielectric layer partially fills the trench. A second dielectric layer is formed over the first dielectric layer such that an air spacer is formed in the trench between the gate and the contact.

According to embodiments of the present invention, a method of fabricating a semiconductor device having an air spacer between a gate and a contact is provided. The method can include forming a gate on a substrate, wherein the gate is also formed over a channel region of a semiconductor fin. A hard mask is formed over a surface of the gate, and a contact is formed on a doped region of the substrate such that the contact is adjacent to the gate. A spacer is formed between the gate and the contact. The hard mask and a portion of the spacer are removed to form a trench between the gate and the contact, and the remaining portion of the spacer partially fills the trench. An interlayer dielectric is formed over the spacer such that an air spacer is formed in the trench between the gate and the contact.

According to embodiments of the present invention, a structure having an air spacer between a gate and a contact is provided. The structure can include a gate disposed above a substrate, wherein the gate is also formed over a channel region of a semiconductor fin. A contact is formed on a doped region of the substrate such that a space between the contact and the gate define a trench. A first dielectric layer partially fills the trench, and a second dielectric layer is formed over the first dielectric layer and the trench. An air spacer is trapped between the gate and the contact, wherein the air spacer is formed in the trench between the first and second dielectric layers.

According to embodiments of the present invention, a method of fabricating a semiconductor device having an air gap between metal interconnect layers is provided. The method can include forming a first and a second contact in a first dielectric layer such that the first contact is adjacent to the second contact. A first cap is formed on a surface of the first contact and a second cap is formed on a surface of the second contact. A portion of the first dielectric layer is removed to expose sidewalls of the first and second contacts such that a space between the first and second contacts defines a trench. A barrier liner is formed over the first and second contacts, the first and second caps, and the first dielectric layer such that the barrier liner partially fills the trench. A second dielectric layer is formed over the barrier liner such that an air gap forms in the trench.

According to embodiments of the present invention, a method of fabricating a semiconductor device having an air gap between metal interconnect layers is provided. The method can include forming a trench in a first dielectric layer and forming a first liner including a first material on the first dielectric layer such that the first liner partially fills the trench. A second liner including a second material is formed on the first liner. A contact is formed in the trench such that the second liner is between the contact and the first dielectric layer. A self-forming third liner including a third material is formed by diffusing a portion of the second material through the first liner.

According to embodiments of the present invention, a structure having an air gap between metal interconnect layers is provided. The structure can include a first and a second contact formed in a first dielectric layer such that the first contact is adjacent to the second contact. A first cap is formed on a surface of the first contact and a second cap is formed on a surface of the second contact. The structure includes a barrier liner formed over the first and second contacts, the first and second caps, and the first dielectric layer, such that the barrier liner partially fills a trench between the first and second contacts. A second dielectric layer is formed over the barrier liner such that a trapped air gap is formed in the trench.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 15 depicts a cross-sectional view of the structure after forming a cap on a surface of the contact according to one or more embodiments of the present invention.

DETAILED DESCRIPTION

Figure 1:
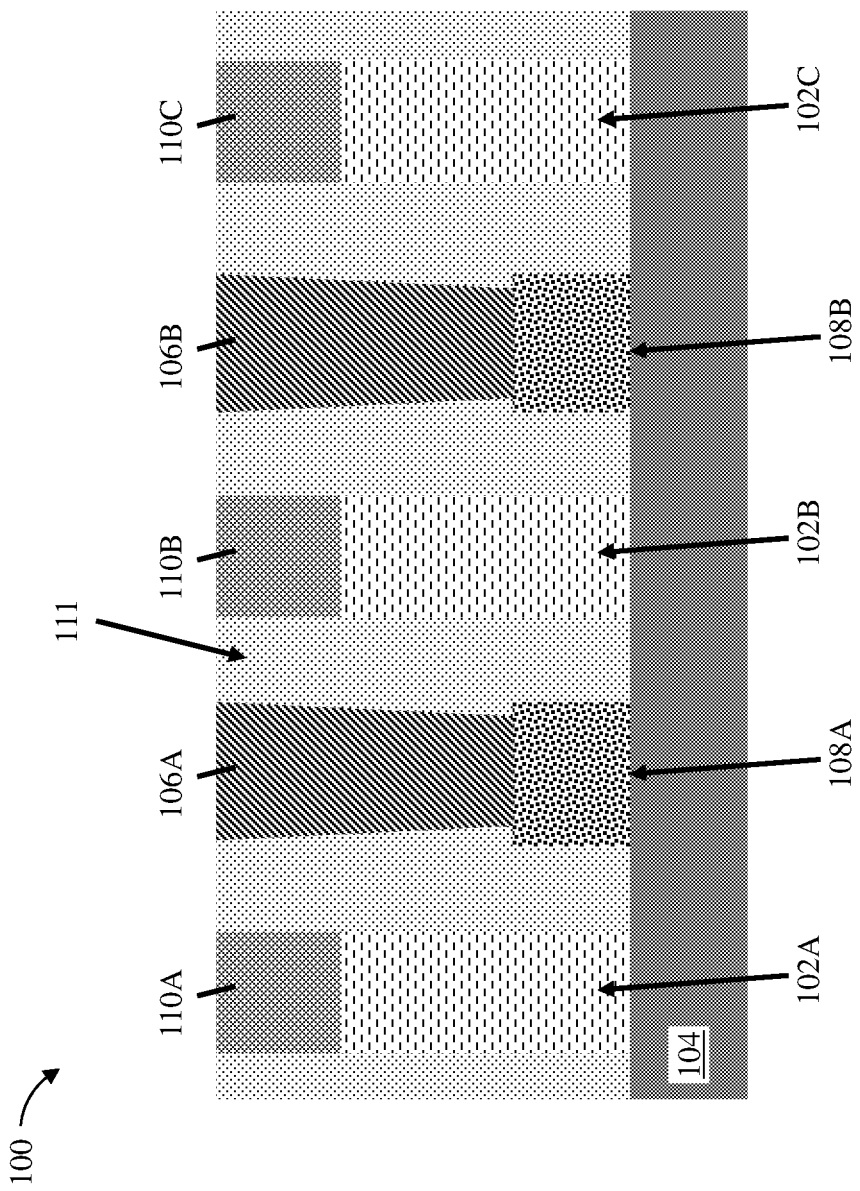
FIG. 1 depicts a cross-sectional view of a structure having gates formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as VFETs, employ semiconductor fins and side-gates that can be contacted outside the active region, resulting in increased device density over lateral devices. However, there are challenges to providing VFETs with equal or superior performance characteristics to lateral devices. As the features of a VFET are reduced in size and increased in aspect ratio, parasitic capacitance effects between features are exacerbated. For example, during front end of line (FEOL) fabrication at the sub-10 nm node, the parasitic capacitance between a gate and an adjacent contact becomes significant. In another example, during back end of line (BEOL) fabrication at intra-level spacing below about 15 nm, parasitic capacitance between interconnects becomes significant. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Thus, a method and structure is desired for reducing the capacitance between a gate and an adjacent contact. A method and structure is also desired for reducing the intra-level capacitance between interconnects.

Turning now to an overview of aspects of the present invention, one or more embodiments provide methods of fabricating a semiconductor device having an air spacer between a gate and a contact. The described methods employ exposing a trench between the gate and the contact. A pocket of air is trapped in the trench by pinching off the trench with a dielectric. The pocket of air serves as an air spacer between the gate and the contact. In other aspects of the present invention, one or more embodiments provide methods of fabricating a semiconductor device having an air gap between interconnects. The described methods employ exposing a trench between adjacent contacts in a dielectric layer. A pocket of air is trapped in the trench by pinching off the trench with a dielectric. The pocket of air serves as an air gap between the contacts. Methods for forming an air spacer and an air gap and the resulting structures therefrom in accordance with embodiments of the present invention are described in detail below by referring to the accompanying drawings in FIGS. 1-15.

FIG. 1 illustrates a cross-sectional view of a structure 100 having gates 102A, 102B, and 102C formed on a substrate 104 during an intermediate operation of a method of fabricating a semiconductor device according to one or more embodiments. The substrate 104 can be any suitable substrate material, such as, for example, monocrystalline Si, SiGe, SiC, III-V compound semiconductor, II-VI compound semiconductor, or semiconductor-on-insulator (SOI). For ease of discussion, reference can be made to operations performed on and to gates 102A, 102B, 102C, and to a single gate (i.e., gate 102B) of the structure 100. It is understood that the structure 100 can include a plurality of gates (e.g., gates 102A, 102B, 102C, and other gates not illustrated for simplicity).

Any known composition and manner of forming the gates 102A, 102B, and 102C can be utilized. The gates 102A, 102B, and 102C (sometimes referred to as gate conductors) can be made of, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, gate 102A includes a cap 110A (sometimes referred to as a hard mask). It is understood that each gate (e.g., 102B, 102C) can include a cap (e.g., cap 110B, 110C).

Contacts 106A and 106B are formed on doped regions 108A and 108B of the substrate 104, respectively. In some embodiments, each contact (e.g., contact 106A) is formed adjacent to a gate (e.g., 102A). In some embodiments, each contact (e.g., contact 106A) is formed between each pair of adjacent gates (e.g., gates 102A and 102B). The doped regions 108A and 108B can each be a source or drain region formed on the substrate 104 by a variety of methods, such as, for example, diffusion, ion implantation of a dopant into the substrate, or in-situ doped epitaxy. The contacts 106A and 106B can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. Any known manner of forming the contacts 106A and 106B can be utilized. In some embodiments, the contacts 106A and 106B are copper and each includes a barrier metal liner. In some embodiments, the barrier metal liner is deposited into a contact trench prior to depositing the contact (not illustrated). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

A first interlayer dielectric (ILD) 111 fills the space between the contact 106A and the adjacent gates 102A and 102B. It is understood that the ILD 111 also fills the space between each adjacent contact and gate. Any known manner of forming the ILD 111 can be utilized. In some embodiments, the ILD 111 is deposited by a spin-on coating operation. In some embodiments, the ILD 111 is formed as a spacer between each adjacent gate and contact (e.g., a spacer between gate 102A and contact 106A). The ILD 111 can be any suitable material, such as, for example, an oxide or carbon doped silicon oxide. In some embodiments, the ILD 111 is silicon dioxide ($SiO_2$) or SiCOH.

Figure 2:
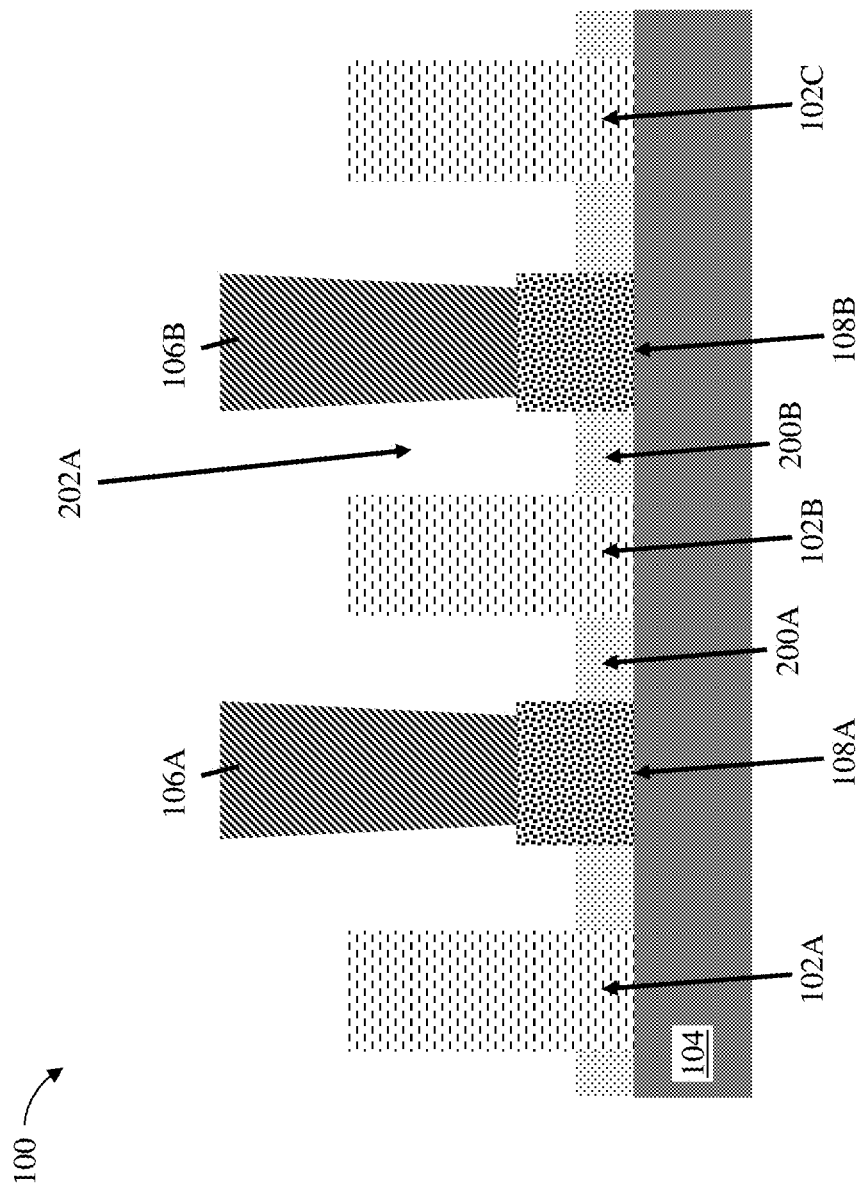
FIG. 2 depicts a cross-sectional view of the structure after removing caps and portions of an interlayer dielectric (ILD) to expose sidewalls of each gate according to one or more embodiments of the present invention.

FIG. 2 illustrates a cross-sectional view of the structure 100 after removing the caps 110A, 110B, and 110C and portions of the ILD 111 to expose sidewalls of each gate 102A, 102B, and 102C. The space between each gate (e.g., gate 102B) and contact (e.g., 106B) defines a trench (e.g., trench 202A). For ease of illustration, only trench 202A is depicted. Remaining portions of the ILD 111 partially fill each trench. For example, remaining portion 200B partially fills the trench 202A. Any known manner of removing the caps 110A, 110B, and 110C and portions of the ILD 111 can be utilized. In some embodiments, an etch process, which can be a wet etch process, a dry etch process or a combination thereof is used. In some embodiments, a directional etch, such as a RIE, selective to the gate material (e.g., gate 102B material) is used to form the trench 202A.

Figure 3:
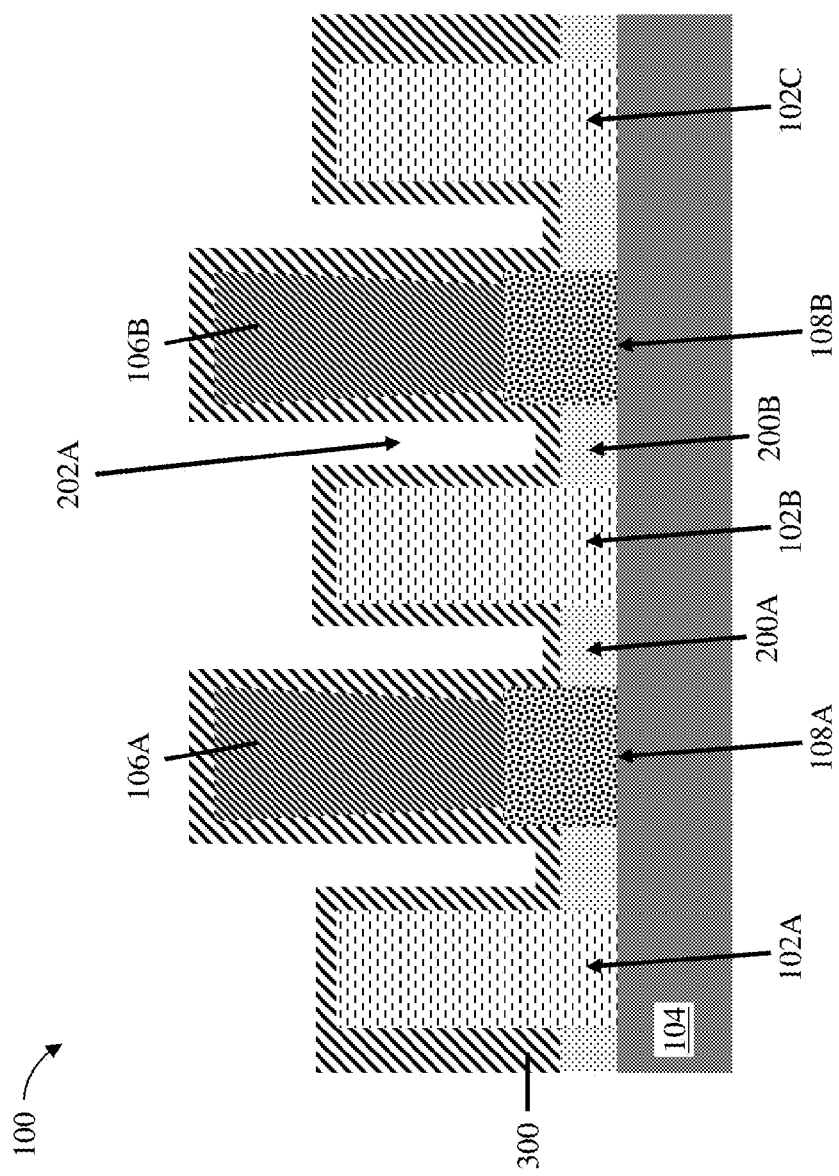
FIG. 3 depicts a cross-sectional view of the structure after forming a first dielectric layer over the gates and the remaining portions of the ILD according to one or more embodiments of the present invention.

FIG. 3 illustrates a cross-sectional view of the structure 100 after forming a first dielectric layer 300 over the gates 102A, 102B, and 102C, the contacts 106A and 106B, and the remaining portions of the ILD 111 (e.g., portions 200A and 200B). The first dielectric layer 300 partially fills each trench (e.g., trench 202A). Any known composition and manner of forming the first dielectric layer 300 can be utilized. In some embodiments, the first dielectric layer 300 is conformal. "Conformal" as used herein means that the thickness of the first dielectric layer 300 is substantially the same on all surfaces, or the thickness variation is less than 50% of the nominal thickness. In some embodiments, the first dielectric layer 300 can be conformally formed using CVD, PECVD, atomic layer deposition (ALD), evaporation, physical vapor deposition (PVD), chemical solution deposition, or other like processes. In some embodiments, the first dielectric layer 300 has a thickness of about 2 nm to about 8 nm. In other embodiments, the first dielectric layer 300 has a thickness of about 3 nm to about 6 nm. In still other embodiments, the first dielectric layer 300 has a thickness of about 3 nm. In some embodiments, the first dielectric layer 300 is a silicon nitride (SiN), $Si_3N_4$, $SiO_2$, a silicon carbonitride (SiCN), a silicoboron carbonitride (SiBCN), or a silicon oxygen carbonitride (SiOCN). In some embodiments, the first dielectric layer 300 is a metal silicate, such as, for example, $MnSiO_x$. In some embodiments, the metal silicate is a low-k dielectric having a dielectric constant less than about 4.0. Metal silicates, such as, for example, $MnSiO_x$, advantageously serve as a copper barrier, thus obviating the need for a separate copper barrier metal liner.

Figure 4:
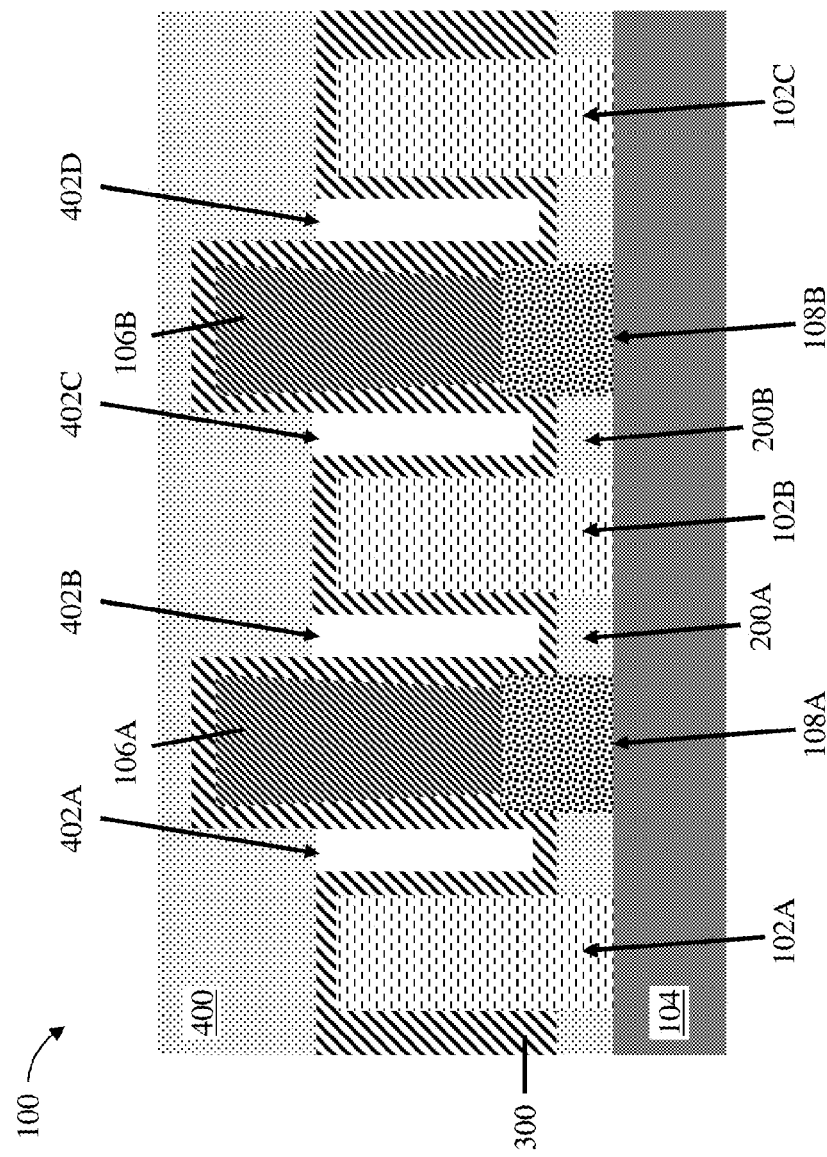
FIG. 4 depicts a cross-sectional view of the structure after forming a second dielectric layer over the first dielectric layer according to one or more embodiments of the present invention.

FIG. 4 illustrates a cross-sectional view of the structure 100 after forming a second dielectric layer 400 over the first dielectric layer 300. Air spacers 402A, 402B, 402C, and 402D each form in a trench between a gate and a contact. For example, air spacer 402C forms in trench 202A between gate 102B and contact 106B. In some embodiments, the second dielectric layer 400 pinches off an opening in each trench to trap an air pocket in each trench (e.g., trench 202A). Each air pocket defines an air spacer. Any known composition and manner of forming the second dielectric layer 400 can be utilized. In some embodiments, the second dielectric layer 400 is nonconformally formed using, for example, PECVD. In some embodiments, the second dielectric layer 400 has a thickness of about 10 nm to about 110 nm. In other embodiments, the second dielectric layer 400 has a thickness of about 30 nm to about 90 nm. In still other embodiments, the second dielectric layer 400 has a thickness of about 80 nm. In some embodiments, the second dielectric layer 400 is a nitride, a silicon nitride, $Si_3N_4$, SiO, $SiO_2$, SiCN, SiBCN, SiOCN, MnSiOx, $MnSiCO_x$, or $MnSiCON_x$. In some embodiments, the second dielectric layer 400 is a low-k dielectric having a dielectric constant of about 3.7 to about 5.1. As air has a low dielectric constant of about 1, the air spacers 402A, 402B, 402C, and 402D serve to reduce the parasitic capacitance between each gate-contact pair. For example, air spacer 402C reduces the parasitic capacitance between gate 102B and contact 106A as well as the parasitic capacitance between gate 102B and contact 106B.

Figure 5:
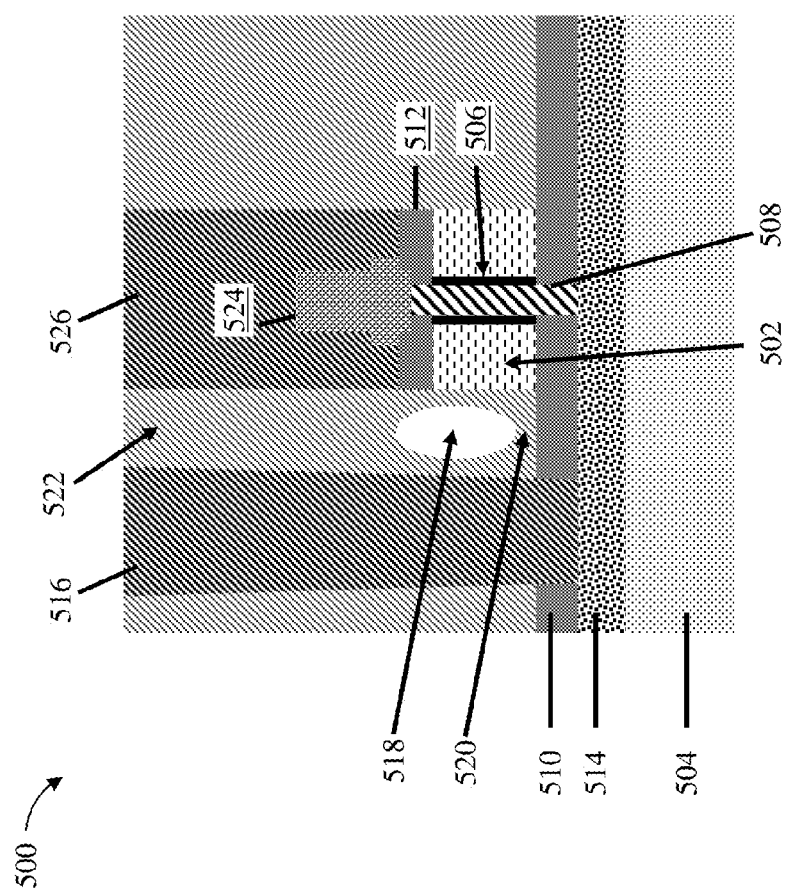
FIG. 5 depicts a cross-sectional view of a structure having a gate formed on a substrate during an intermediate operation of a method of fabricating a semiconductor device according to one or more embodiments of the present invention.

FIG. 5 illustrates a cross-sectional view of a structure 500 having a gate 502 formed on a substrate 504 during an intermediate operation of a method of fabricating a semiconductor device according to one or more embodiments. In some embodiments, gate 502 includes a gate dielectric (e.g., high-k dielectric) region 506 defining a channel interface between the gate 502 and a semiconductor fin 508. In some embodiments, the gate dielectric region 506 is formed between the gate 502 and the semiconductor fin 508 to modify the work function of the gate 502. The gate 502 can further include a work function metal layer (not depicted) next to the gate dielectric region 506. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof, during an operation for forming a VFET, according to one or more embodiments.

The gate dielectric region 506 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric region can have a thickness of about 0.5 nm to about 4 nm. In other embodiments, the gate dielectric region can have a thickness of about 2 nm to about 3 nm.

In some embodiments, the gate 502 is formed between a bottom spacer 510 and a top spacer 512. In some embodiments, the bottom spacer 510 is formed on a doped region 514 of the substrate 504. The bottom spacer 510 and the top spacer 512 can be any suitable material, such as, for example, a low-k dielectric, a nitride, silicon nitride, SiOCN, SiBCN, MnSiOx, MnSiCO$_x$, or MnSiCON$_x$. In some embodiments, the bottom spacer 510 and the top spacer 512 are different materials.

The semiconductor fin 508 can be formed on the doped region 514 using known semiconductor fabrication techniques. For example, in some embodiments, a patterned hard mask (not illustrated) is etched to expose portions of the substrate 504. The exposed portions of the substrate 504 can be removed to form a plurality of semiconductor fins, including, e.g., semiconductor fin 508. The patterned hard mask is then removed using an etch process, which can be a wet etch process, a dry etch process or a combination thereof. The semiconductor fin 508 can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. The hard mask can be any suitable material, such as, for example, a nitride or silicon nitride. In some embodiments, a plurality of semiconductor fins is formed on the bottom doped region 514. In some embodiments, the fin pitch, or spacing, between each semiconductor fin can be about 20 nm to about 100 nm. In other embodiments, the fin pitch is about 30 nm to about 50 nm.

A contact 516 is formed on the doped region 514 of the substrate 504. The contact 516 can be of any suitable conducting material formed in a like manner as the contacts 106A and 106B (as depicted in FIG. 1). The contact 516 can be, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

An air spacer 518 is formed between the contact 516 and the gate 502 according to one or more embodiments. The air spacer 518 serves to reduce the parasitic capacitance between the gate 502 and the contact 516. In some embodiments, the air spacer 518 is trapped between a first dielectric layer 520 and a second dielectric layer 522 (also referred to as an interlayer dielectric) according to one or more embodiments.

In some embodiments, a top epitaxy region 524 is formed on a portion of the semiconductor fin 508. Any known manner of forming the top epitaxy region 524 can be utilized. In some embodiments, epitaxial growth, CVD, ECD, MBE, or ALD is employed to form the top epitaxy region 524. In some embodiments, the top epitaxy region 524 is in-situ doped. In some embodiments, the top epitaxy region 524 is formed using ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), or molecular beam epitaxy (MBE). Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm-3 to $2\times10^{21}$ cm$^{-3}$, or preferably between $2\times10^{20}$ cm$^{-3}$ to $1\times10^{21}$ cm$^{-3}$.

In some embodiments, a gate contact 526 is formed on the top epitaxy region 524, above the gate 502. Any known manner of forming the gate contact 526 can be utilized. In some embodiments, the gate contact 526 can be copper. In some embodiments, the first dielectric layer 520 is a conformal metal silicate liner formed over the gate contact 526, the gate 502, and the contact 516. The first dielectric layer 520 can be, for example, MnSiO$_x$, MnSiCO$_x$, or MnSiCON$_x$. The metal silicate liner serves as a copper barrier, thus obviating the need for a separate copper barrier metal liner, according to one or more embodiments.

Figure 6:
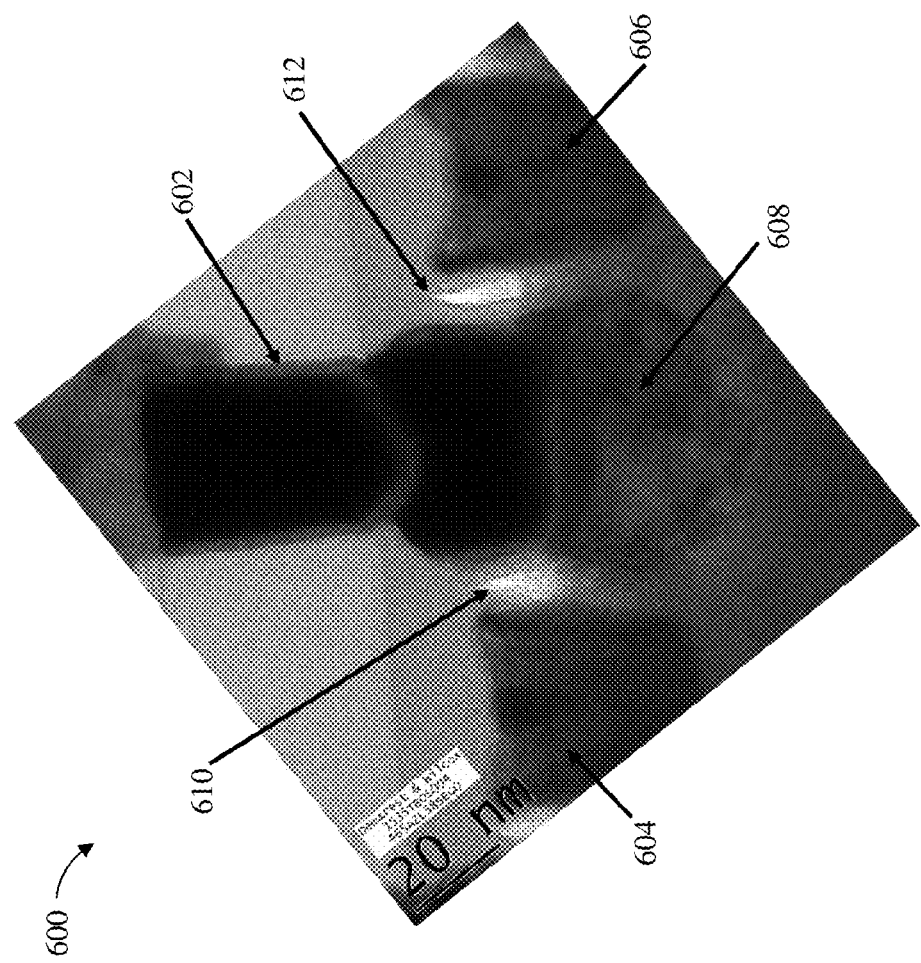
FIG. 6 depicts a cross-sectional view of a structure having a contact between a first gate and a second gate during an intermediate operation of a method of fabricating a semiconductor device according to one or more embodiments of the present invention.

FIG. 6 illustrates a cross-sectional view of a structure 600 having a contact 602 between a first gate 604 and a second gate 606 during an intermediate operation of a method of fabricating a semiconductor device according to one or more embodiments. The contact 602 is formed on a doped region 608. Air spacer 610 is formed between the contact 602 and the first gate 604 according to one or more embodiments. Air spacer 612 is formed between the contact 602 and the second gate 606 according to one or more embodiments.

Figure 7:
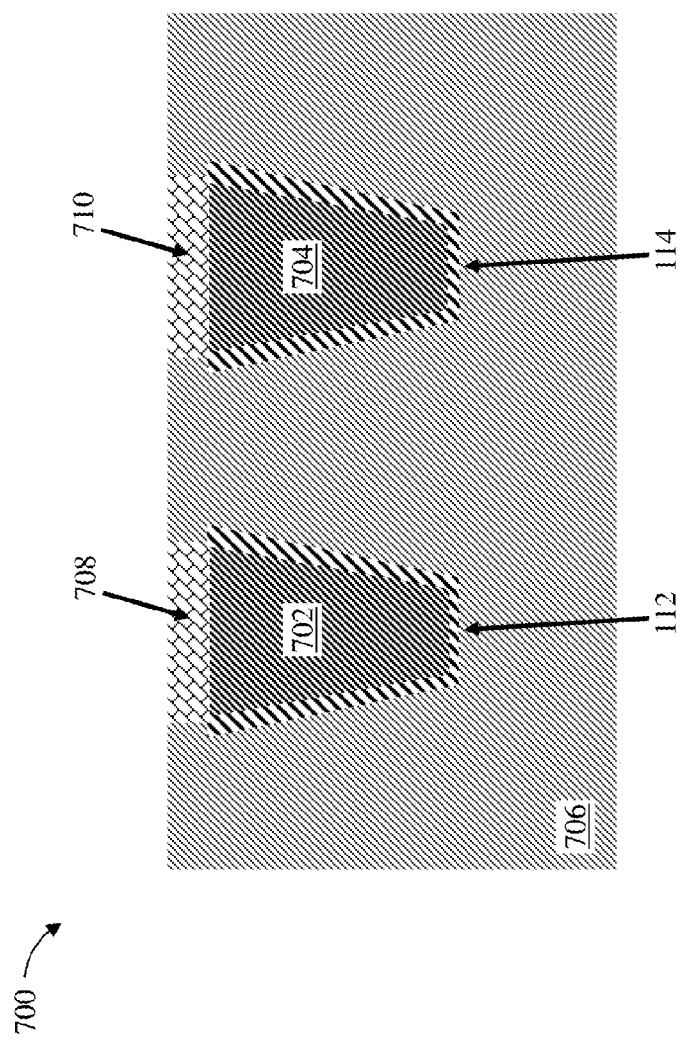
FIG. 7 depicts a cross-sectional view of a structure having a first contact and a second contact formed in a first dielectric layer during an intermediate operation of a method of fabricating a semiconductor device according to one or more embodiments of the present invention.

FIG. 7 illustrates a cross-sectional view of a structure 700 having a first contact 702 and a second contact 704 formed in a first dielectric layer 706, during an intermediate operation of a method of fabricating a semiconductor device according to one or more embodiments. The first contact 702 is adjacent to the second contact 704. Any known composition and manner of forming the contacts 702 and 704 can be utilized. In some embodiments, the contacts 702 and 702 are made of, for example, copper. The first dielectric layer 702 can be any known dielectric material, such as, for example, an oxide.

In some embodiments, a cap 708 is formed on the first contact 702. A cap 710 is similarly formed on the second contact 704. The caps 708 and 710 can be of any suitable conducting material, such as, for example, a metal (e.g., Cobalt, tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

In some embodiments, an inner liner 112 is formed between the first contact 702 and the first dielectric layer 706, and an inner liner 114 is formed between the second contact 704 and the first dielectric layer 706. The inner liners 112 and 114 can serve as both a diffusion barrier (also known as a barrier metal liner) and as an adhesion promoting layer, according to one or more embodiments. The inner liners 112 and 114 can be of any suitable material, such as, for example, tantalum nitride (TaN), cobalt, or ruthenium.

Figure 8:
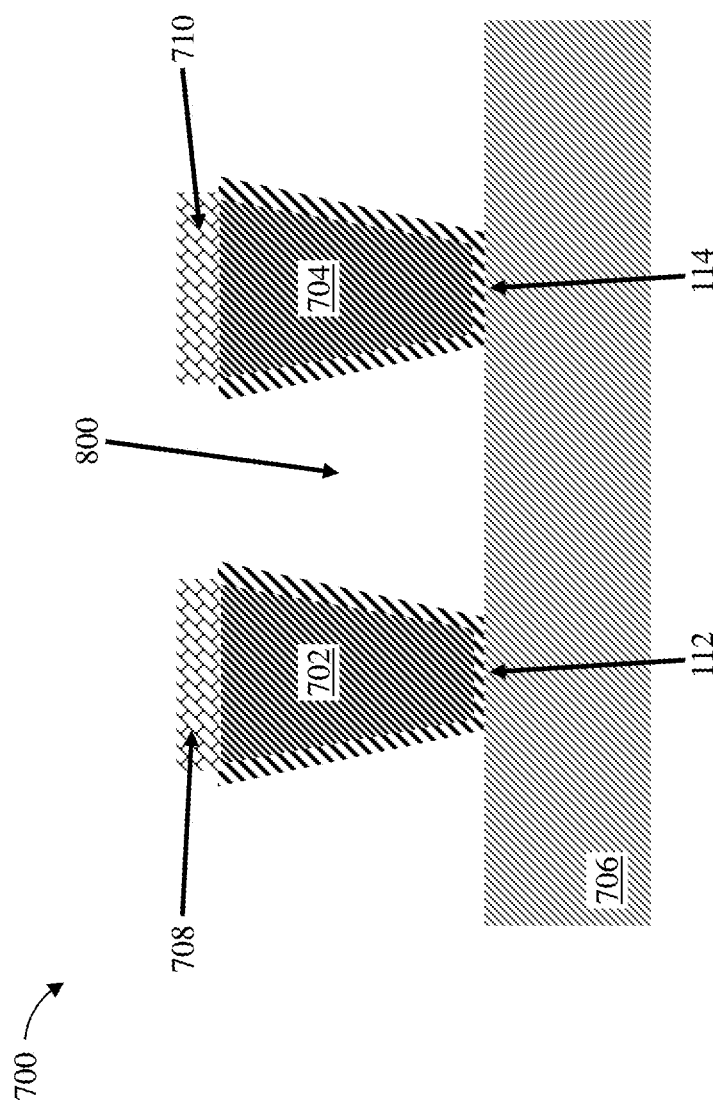
FIG. 8 depicts a cross-sectional view of the structure after removing portions of the first dielectric layer to expose sidewalls of the first and second contacts according to one or more embodiments of the present invention.

FIG. 8 illustrates a cross-sectional view of the structure 700 after removing portions of the first dielectric layer 706 to expose sidewalls of the first and second contacts 702 and 704. Any known manner of removing portions of the first dielectric layer 706 can be utilized. In some embodiments, an etch process, which can be a wet etch process, a dry etch process or a combination thereof is used. In some embodiments, the first dielectric layer 706 is exposed to plasma to create damage and a wet etch selectively removes the damaged dielectric material. Removing portions of the first dielectric layer 706 forms a trench 800 between the first contact 702 and the second contact 704. In some embodiments, the trench 800 has an aspect ratio of greater than about 1.3. In some embodiments, the trench 800 has an aspect ratio of greater than about 1.5.

Figure 9:
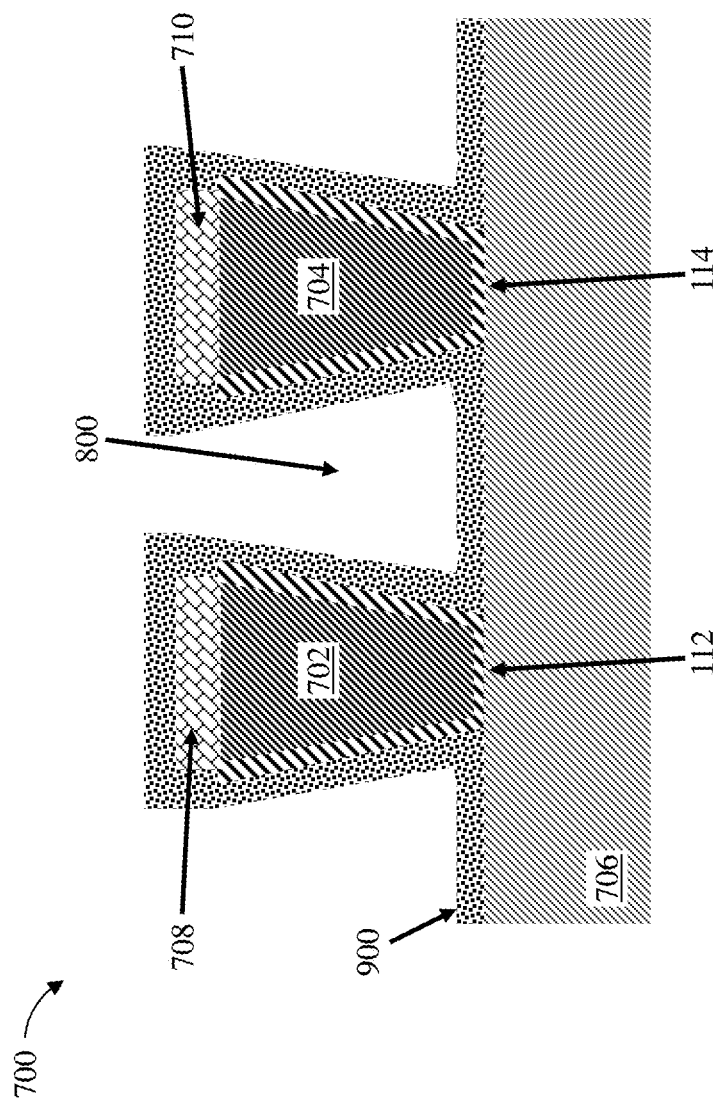
FIG. 9 depicts a cross-sectional view of the structure after forming a barrier liner over the contacts, the first and second caps, and the first dielectric layer according to one or more embodiments of the present invention.

FIG. 9 illustrates a cross-sectional view of the structure 700 after forming a barrier liner 900 over the contacts 702 and 704, the first and second caps 708 and 710, and the first dielectric layer 706. The barrier liner 900 partially fills the trench 800. The barrier liner 900 can be of any suitable material. In some embodiments, the barrier liner 900 is a metal silicate, such as, for example, $MnSiO_x$, $MnSiCO_x$, and MnSiCNO. In some embodiments, the metal silicate barrier liner 900 is directly deposited using, for example, PEALD or PECVD. As described previously herein, a thick copper barrier metal liner is typically required around copper contacts to prevent copper diffusion into the surrounding materials. As these metal silicates serve as a copper barrier, the copper barrier metal liner can be significantly reduced in thickness or removed entirely.

Figure 10:
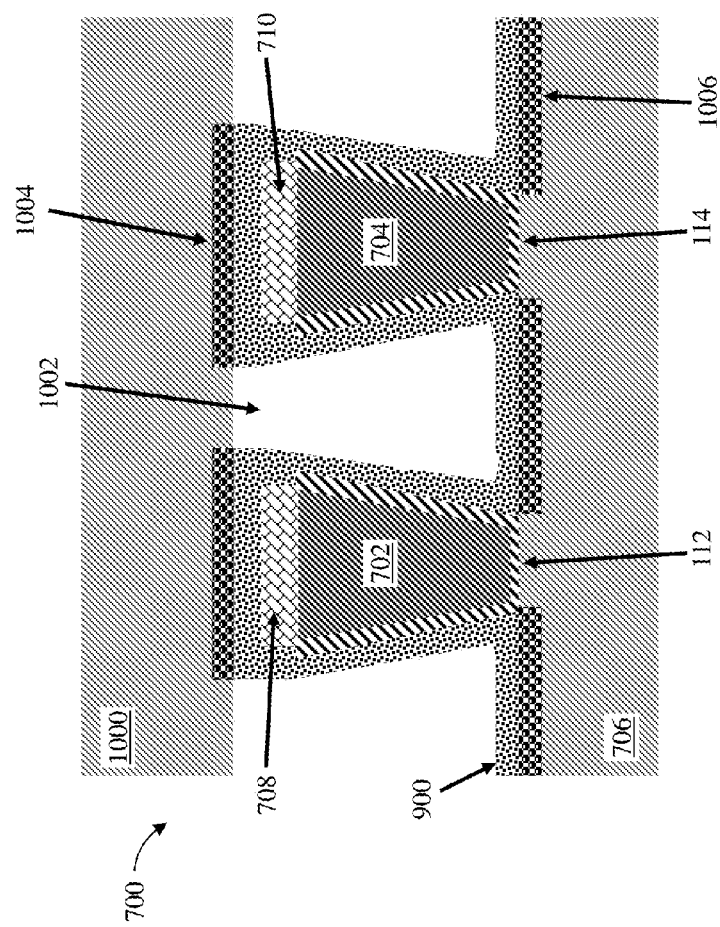
FIG. 10 depicts a cross-sectional view of the structure after forming a dielectric layer over portions of the barrier liner, trapping a pocket of air in the trench between the contacts according to one or more embodiments of the present invention.

FIG. 10 illustrates a cross-sectional view of the structure 700 after forming a dielectric layer 1000 over portions of the barrier liner 900, trapping a pocket of air 1002 (also referred to as an air gap) in the trench 800 between the contacts 702 and 704. In some embodiments, the dielectric layer 1000 is nonconformally deposited to pinch off an opening of the trench 800. As air has a low dielectric constant of about 1, the air gap 1002 reduces the parasitic capacitance between the contacts 702 and 704.

In some embodiments, portions 1004 and 1006 of the barrier liner 900 are self-forming layers which are not directly deposited. Instead, an intermediate film (e.g., barrier liner 900) including a first material is conformally deposited over the first and second contacts 702 and 704, the film partially filling the trench 800. The first material can be, for example, Mn or $MnN_y$. A dielectric layer 1000 including a second material is formed on portions of the film. The second material can be any suitable dielectric material, such as, for example, a low-k dielectric, $SiO_x$, $SiCO_x$, SiCNO, and porous SiCOH. A thermal or UV based annealing process self-forms the portions 1004 and 1006 of the barrier liner 900 by causing the contacting portions of the first material and the second material to react. The final composition of the portions 1004 and 1006 of the barrier liner 900 depends upon the composition of the film and the dielectric layer 1000. In some embodiments, the portions 1004 and 1006 are self-formed metal silicates, such as, for example, $MnSiO_x$, $MnSiCO_x$, and MnSiCNO. For example, if the film is Mn and the dielectric layer 1000 is $SiO_x$, then the annealing process will generate a self-forming $MnSiO_x$ barrier liner 900. In another example, if the film is $MnN_y$ and the dielectric layer 1000 is SiCNO, then the annealing process will generate a self-forming $MnN_ySiCNO$ barrier liner 900. For clarity, only portions 1004 and 1006 are depicted. It is understood that all portions of the barrier liner 900 in contact with portions of the first or second dielectric layers 706 and 1000 self-form in a similar manner during the annealing process.

Figure 11:
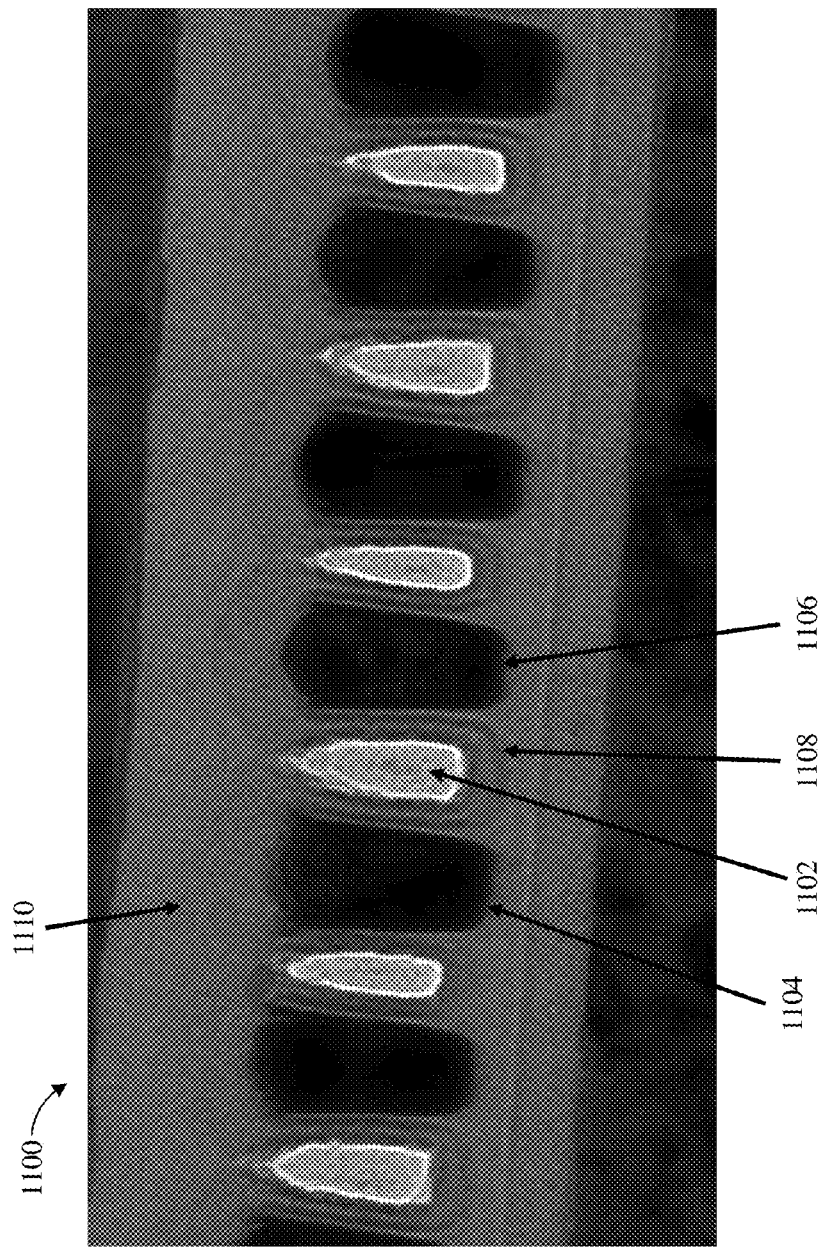
FIG. 11 depicts a cross-sectional view of a structure having an air gap formed between a first contact and a second contact during an intermediate operation of a method of fabricating a semiconductor device according to one or more embodiments of the present invention.

FIG. 11 illustrates a cross-sectional view of a structure 1100 having an air gap 1102 formed between a first contact 1104 and a second contact 1106 during an intermediate operation of a method of fabricating a semiconductor device according to one or more embodiments. A metal silicate conformal liner 1108 is formed over the contacts 1104 and 1106, according to one or more embodiments. A nonconformal interlayer dielectric 1110 is formed to trap the air gap 1102, according to one or more embodiments. For clarity, only operations regarding air gap 1102 are depicted. It is understood that a plurality of air gaps are formed in this manner.

Figure 12:
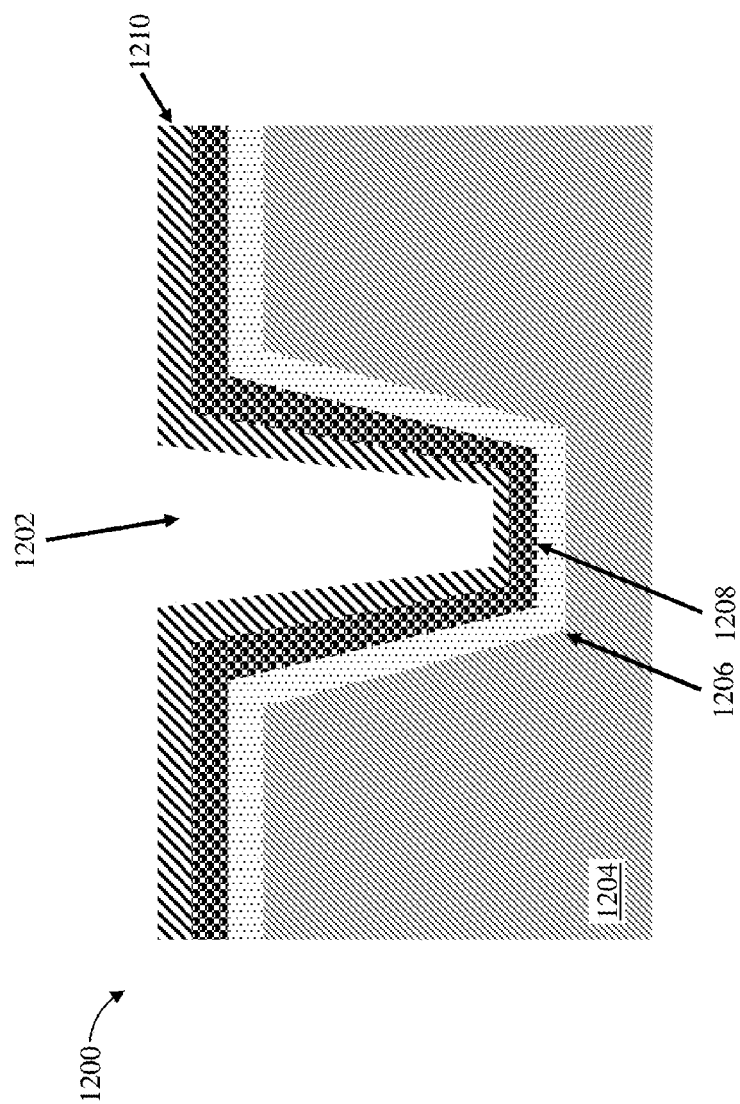
FIG. 12 depicts a cross-sectional view of a structure after forming a trench in a first dielectric layer during an intermediate operation of a method of fabricating a semiconductor device according to one or more embodiments of the present invention.

FIG. 12 illustrates a cross-sectional view of a structure 1200 after forming a trench 1202 in a first dielectric layer 1204 during an intermediate operation of a method of fabricating a semiconductor device according to one or more embodiments. Any known manner of forming the trench 1202 can be utilized. In some embodiments, an etch process, which can be a wet etch process, a dry etch process or a combination thereof is used to remove portions of the first dielectric layer 1204.

A metal barrier liner 1206 is formed between a first liner 1208 and the first dielectric layer 1204, according to one or more embodiments. The metal barrier liner 1206 serves as an adhesion layer for the first liner 1208 and can be, for example, TaN. The metal barrier liner 1206 partially fills the trench 1202. The first liner 1208 can be of any suitable material, such as, for example, cobalt. The first liner 1208 can be conformally formed on the metal barrier liner 1206 using CVD, PECVD, ALD, PVD, chemical solution deposition, or other like processes.

A second liner 1210 is formed on the first liner 1208. In some embodiments, the second liner 1210 is conformal. The second liner 1210 can be of any suitable material, such as, for example, manganese. The second liner 1212 can be conformally formed on the first liner 1208 using CVD, PECVD, ALD, PVD, chemical solution deposition, or other like processes.

Figure 13:
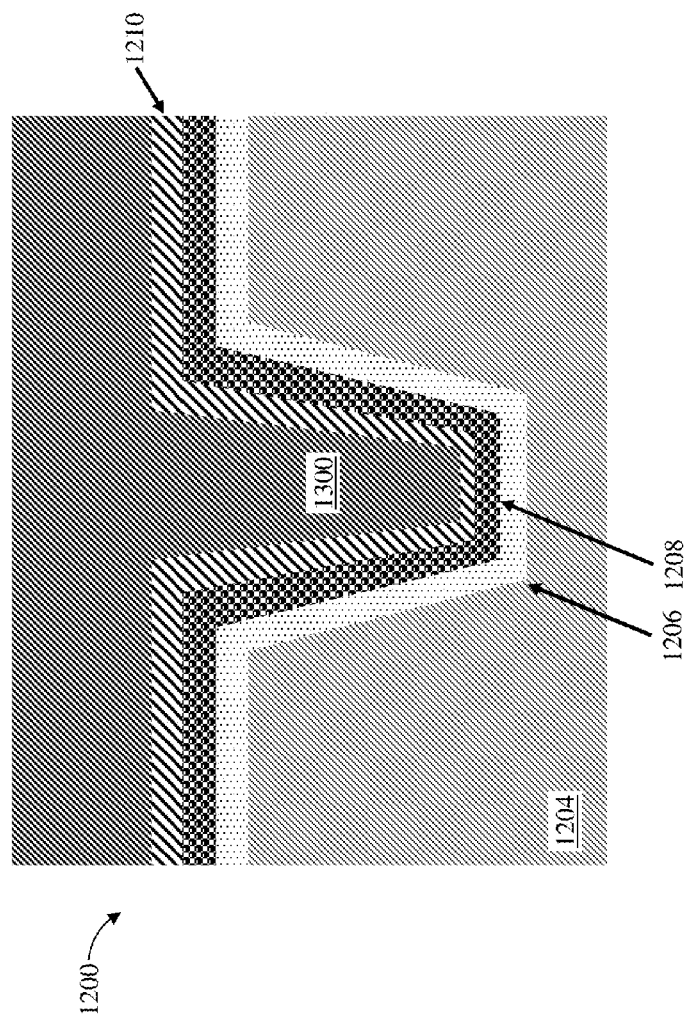
FIG. 13 depicts a cross-sectional view of the structure after forming a contact in the trench according to one or more embodiments of the present invention.

FIG. 13 illustrates a cross-sectional view of the structure 1200 after forming a contact 1300 in the trench 1202. In some embodiments, the contact 1300 is deposited to overfill the trench 1202, forming an overburden above a surface of the second liner 1210. In some embodiments, the contact 1300 is copper formed using known copper electroplating processes followed by known post-plating annealing processes.

Figure 14:
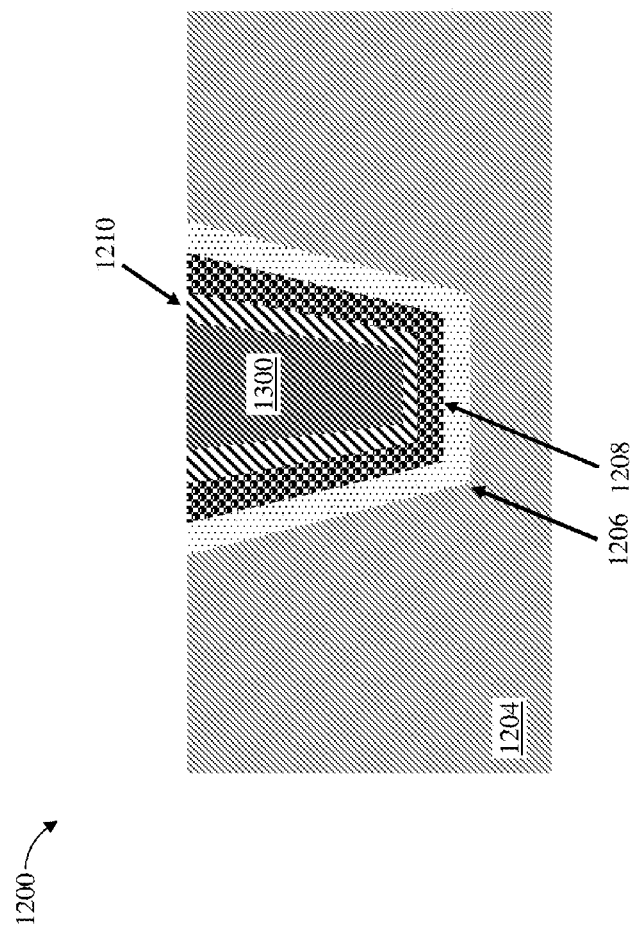
FIG. 14 depicts a cross-sectional view of the structure after planarizing a surface of the contact selective to the first dielectric layer to remove overburden according to one or more embodiments of the present invention.

FIG. 14 illustrates a cross-sectional view of the structure 1200 after planarizing a surface of the contact 1300 selective to the first dielectric layer 1204 to remove the overburden. The contact 1300 can be planarized using any known process, such as, for example, CMP.

FIG. 15 illustrates a cross-sectional view of the structure 1200 after forming a cap 1500 on a surface of the contact 1300 according to one or more embodiments. The cap can be of any suitable material, such as, for example, SiNC, SiCNO, SiNx, SiNO, or SiC. A self-forming layer 1502 (also referred to as a third liner) is formed by diffusion of a material of the second liner 1210 across the first liner 1208. The diffused material of the second liner 1210 reacts with the metal barrier liner 1206 to form a third material (i.e., the material of self-forming layer 1502). The final composition of the self-forming layer 1502 depends upon the composition of the metal barrier liner 1206, the first liner 1208, and the second liner 1210. In some embodiments, the self-forming layer 1502 is a metal silicate, such as, for example, TaMn$_x$O$_y$, TaMnSiO$_x$, TaMnSiCO$_x$, TaMnSiCNO, MnSiO$_x$, MnSiCO$_x$, and MnSiCNO. For example, if the metal barrier liner 1206 is TaN, the first liner 1208 is cobalt, and the second liner 1210 is manganese, the manganese will diffuse across the first liner 1208 and react with the TaN in the metal barrier liner 1206 to form TaMn$_x$O$_y$.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a gate on a substrate and over a channel region of a semiconductor fin;
    forming a hard mask over a surface of the gate;
    forming a contact on a doped region of the substrate, the contact adjacent to the gate;
    forming a spacer between the gate and the contact;
    removing the hard mask and a portion of the spacer to form a trench between the gate and the contact, a remaining portion of the spacer partially filling the trench; and
    forming an interlayer dielectric over the remaining portion of the spacer such that an air spacer forms in the trench between the gate and the contact.

2. The method of claim 1, further comprising: forming a first dielectric layer over the remaining portion of the spacer, the first dielectric layer between the remaining portions of the spacer and the interlayer dielectric.

3. The method of claim 2, wherein forming the first dielectric layer comprises conformally depositing the first dielectric layer over the gate, the contact, and the remaining portion of the spacer.

4. The method of claim 2, wherein the first dielectric layer comprises MnSiOx, MnSiCOx, or MnSiCONx.

5. The method of claim 1, wherein forming the interlayer dielectric comprises nonconformally depositing the interlayer dielectric over the trench to pinch off an opening of the trench.

6. The method of claim 1, wherein the interlayer dielectric comprises a low-k dielectric, a nitride, a silicon nitride (SiN), a silicon carbonitride (SiCN), a silicon oxygen carbonitride (SiOCN), or a silicoboron carbonitride (SiBCN).

7. The method of claim 1, further comprising:
    forming a plurality of adjacent gates on the substrate, each gate of the plurality of adjacent gates formed over a channel region of a semiconductor fin;
    forming a contact between each pair of adjacent gates, each contact formed on a doped region of the substrate, each contact separated from a first gate by a first space and a second gate by a second space, each space defining a trench; and
    forming the interlayer dielectric over each trench such that an air spacer forms in each trench.

* * * * *